(12) United States Patent
Lin et al.

(10) Patent No.: US 12,225,834 B2
(45) Date of Patent: Feb. 11, 2025

(54) METHOD FOR FORMING SEMICONDUCTOR STRUCTURE

(71) Applicant: TAIWAN SEMICONDUCTOR MANUFACTURING COMPANY LTD., Hsinchu (TW)

(72) Inventors: Hsing-Lien Lin, Hsin-Chu (TW); Hai-Dang Trinh, Hsinchu (TW); Fa-Shen Jiang, Taoyuan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 146 days.

(21) Appl. No.: 17/335,831

(22) Filed: Jun. 1, 2021

(65) Prior Publication Data
US 2021/0288248 A1    Sep. 16, 2021

Related U.S. Application Data

(62) Division of application No. 16/157,736, filed on Oct. 11, 2018, now Pat. No. 11,038,101.

(60) Provisional application No. 62/589,220, filed on Nov. 21, 2017.

(51) Int. Cl.
*H10N 70/20*    (2023.01)
*H10B 63/00*    (2023.01)
*H10N 70/00*    (2023.01)

(52) U.S. Cl.
CPC ......... *H10N 70/231* (2023.02); *H10N 70/011* (2023.02); *H10N 70/066* (2023.02); *H10N 70/826* (2023.02); *H10N 70/841* (2023.02); *H10N 70/8413* (2023.02); *H10N 70/8613* (2023.02); *H10B 63/30* (2023.02); *H10N 70/8828* (2023.02); *H10N 70/884* (2023.02)

(58) Field of Classification Search
None
See application file for complete search history.

(56) References Cited

U.S. PATENT DOCUMENTS

| | | | |
|---|---|---|---|
| 9,620,453 B2 * | 4/2017 | Preusse | H01L 21/28556 |
| 2010/0243981 A1 * | 9/2010 | Kang | H10N 70/231 |
| | | | 257/3 |
| 2012/0228577 A1 * | 9/2012 | Park | H01L 45/144 |
| | | | 257/4 |

FOREIGN PATENT DOCUMENTS

KR    20100089132 A    *   8/2010    ........... H10N 70/066

* cited by examiner

*Primary Examiner* — Telly D Green
(74) *Attorney, Agent, or Firm* — WPAT LAW; Anthony King (57) ABSTRACT

A method for forming a semiconductor structure includes following operations. A first conductive layer is formed. A first dielectric layer is formed over the first conductive layer, and the first dielectric layer includes at least one trench exposing the first conductive layer. A second conductive layer is formed in the trench. A third conductive layer is formed in the trench, and a resistivity of the third conductive layer is greater than a resistivity of the second conductive layer. A second dielectric layer is formed over the third conductive layer. A phase change material is formed over the first dielectric layer.

20 Claims, 10 Drawing Sheets

METHOD FOR FORMING SEMICONDUCTOR STRUCTURE

PRIORITY DATA

This patent is a divisional application of U.S. patent application Ser. No. 16/157,736 filed Oct. 11, 2018, which claims the benefit of U.S. Provisional Patent Application Ser. No. 62/589,220 filed Nov. 21, 2017, the entire disclosure of which is hereby incorporated by reference.

BACKGROUND

Phase change technology is promising for next generation memories. It uses chalcogenide semiconductors for storing data. The chalcogenide semiconductors, also called phase change materials, have a crystalline state and an amorphous state. In the crystalline state, the phase change materials have a low resistivity, while in the amorphous state the phase change materials have a high resistivity, and thus the phase change memory devices are unlikely to have erroneous reading. The chalcogenide semiconductor materials are stable at certain temperature ranges in both crystalline and amorphous states and can be switched back and forth between the two states by electric pulses. One type of memory device that uses the principle of phase change in chalcogenide semiconductors is commonly referred to as phase change random access memory (PCRAM).

PCRAM has several operating and engineering advantages, including high speed, low power, non-volatile, high density, and low cost. In addition, PCRAM memory cells ae compatible with CMOS logic and can generally be produced at a low cost compared to other types of memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

A phase change memory (PCM) cell includes a phase change material arranged over a heating element and a dielectric element surrounded by and abutting the heating element. Further, a top electrode is arranged over the phase change element, and a bottom electrode is arranged below the heating elements. In some embodiments, the phase change memory cell is integrated in an interconnect structure, and thus a metal layer or a via may serve as the bottom electrode of the phase change memory cell. The data state of the phase change memory cell is switched between "1" and "0" by heating the phase change material to cause reversible switches between crystalline and amorphous state of the phase change material. However, it is found that the heat also causes metal diffusion from the metal layer that is serving as the bottom electrode. Consequently, metal loss is caused due to the high temperature required to cause the state switch. The metal loss issue adversely impacts the reliability of the interconnect structure. Further, the metal loss issue can even form an open circuit in the interconnect structure as a size of the heating element is reduced to less than 65 nanometers (nm).

The present disclosure therefore provides a semiconductor structure including a memory device and a method for forming the same. In the semiconductor structure, a heat-buffering layer is introduced between the heating element of the memory device and the metal layer of the interconnect structure, and thus heat required to cause the state change for the phase change material is buffered from the metal layer in the interconnect structure. Consequently, metal diffusion and metal loss issue are both mitigated by the heat-buffering layer, and thus reliability of the phase change memory cell and the interconnect structure are both improved.

Figure 1:
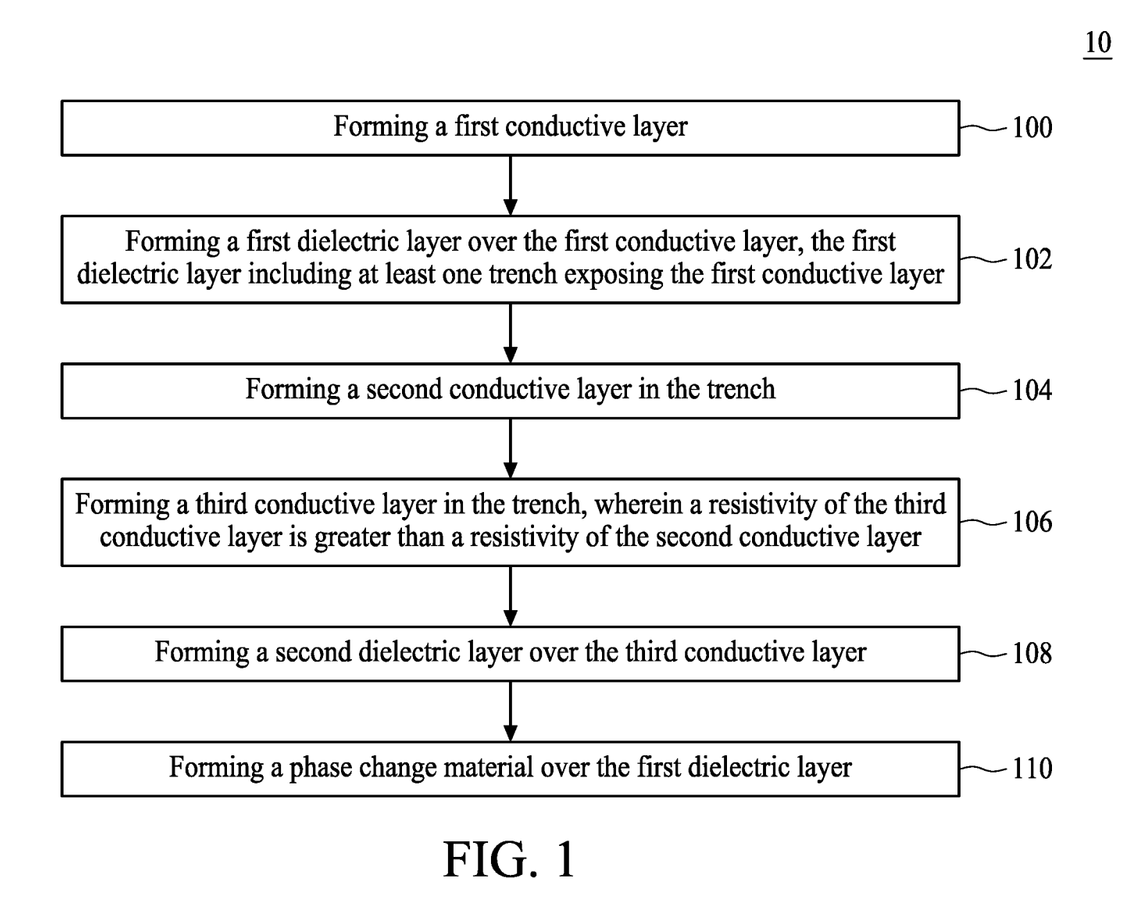
FIG. 1 shows a flow chart representing method for forming a semiconductor structure according to aspects of the present disclosure.

FIG. 1 shows a flow chart representing a method for forming a semiconductor structure 10 according to aspects of the present disclosure. In some embodiments, the method 10 includes an operation 100: forming a first conductive layer. The method 10 further includes an operation 102: forming a first dielectric layer over the first conductive layer, the first dielectric layer including at least one trench exposing the first conductive layer. The method 10 further includes an operation 104: forming a second conductive layer in the trench. The method 10 further includes an operation 106: forming a third conductive layer in the trench, wherein a resistivity of the third conductive layer is greater than a resistivity of the second conductive layer. The method 10 further includes an operation 108: forming a second dielectric layer over the third conductive layer. The method 10 further includes an operation 110: forming a phase change material over the first dielectric layer. The method 10 will be further described according to one or more embodiments. It should be noted that the operations of the method for forming the semiconductor structure 10 may be rearranged or otherwise modified within the scope of the various aspects. It is further noted that additional operations may be provided before, during, and after the method 10, and that some other operations may only be briefly described herein. Thus other implementations are possible within the scope of the various aspects described herein.

Figure 2A:
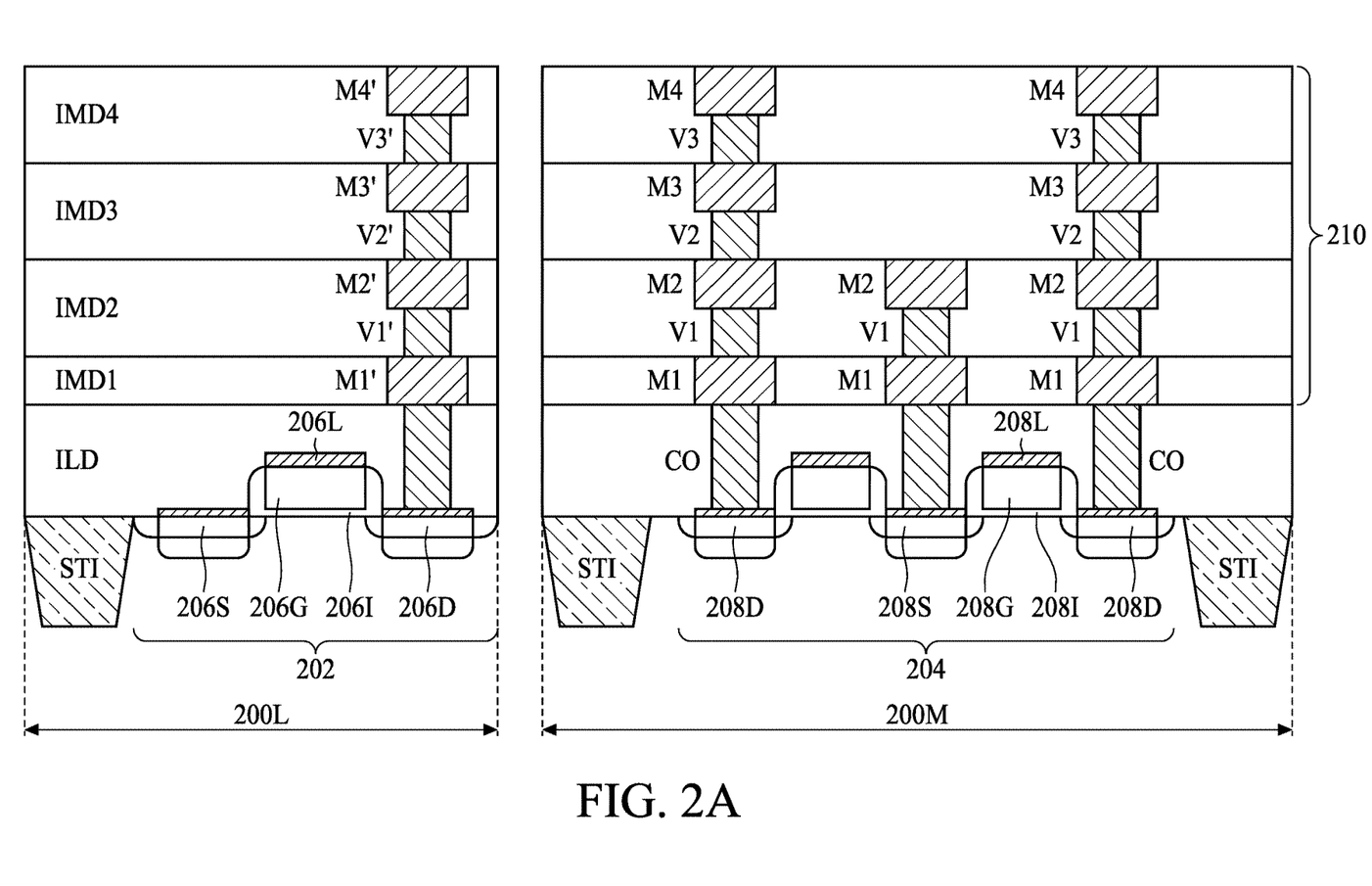
FIGS. 2A-2I are schematic drawings illustrating a semiconductor structure at various fabrication stages constructed according to aspects of the present disclosure in one or more embodiments.

FIGS. 2A-2I are schematic drawings illustrating a semiconductor structure including a memory device at various fabrication stages constructed according to aspects of the present disclosure in one or more embodiments. Further, FIGS. 2A-2H are enlarged views of a portion of the semiconductor structure including the memory device at various fabrication stages constructed according to aspects of the present disclosure in one or more embodiments. Referring to FIG. 2A, a substrate can be received. The substrate may be a semiconductor substrate formed of commonly used semiconductor materials such as silicon (Si), silicon germanium (SiGe), gallium arsenide (GaAs), and the like, and may be a bulk substrate or a semiconductor-on-insulator (SOI) substrate. In some embodiments, the substrate can include a plurality of functional regions. The plurality of functional regions can be defined and electrically isolated from each other by isolation structures, such as shallow trench isolations (STIs), but the not limited thereto. For example but not limited to, the substrate can include a logic region 200L and a memory region 200M that are defined and electrically isolated from other functional regions by the STIs. The logic region 200L may include circuitry, such as the exemplary transistor 202, for processing information received from memory cells and for controlling reading and writing functions of the memory cells. In some embodiments, access transistors 204 are disposed in the memory region 200M. The transistor 202 in the logic region 200L can include a gate dielectric layer 206I, a gate conductive layer 206G, source/drain regions 206S/206D, and silicides 206L, but the disclosure is not limited to this. The access transistors 204 in the memory region 200M can include a gate dielectric layer 208I, a gate conductive layer 208G, source/drain regions 208S/208D, and silicides 208L, but the disclosure is not limited to this. For simplicity, components such as spacers and contact etch stop layer (CESL) that are commonly formed in integrated circuits are not illustrated and/or detailed.

Still referring to FIG. 2A, an inter-layer dielectric layer ILD is formed over the transistor 202 and the access transistors 204, and contact plugs CO are formed in the inter-layer dielectric layer ILD for providing electrical connections between other circuitry/elements and the source/drain regions 206S/206D of the transistor 204, and between other circuitry/elements and the source/drain regions 208S/208D of the access transistors 204. The formation operations of the contact plugs CO can include forming openings in the inter-layer dielectric layer ILD, filling the openings and performing a planarization such as chemical mechanical polish (CMP). For simplicity, the gate contact plug is not shown, although it is also formed simultaneously with the contact plugs CO shown in FIG. 2A. In some embodiments, the contact plugs CO can include tungsten (W), but other suitable conductive material such as silver (Ag), aluminum (Al), copper (Cu), AlCu, and the like may also be used or added.

Still referring to FIG. 2A, an interconnect structure 210 is disposed over the inter-layer dielectric layer ILD and the contact plugs CO. In some embodiments, the interconnect structure 210 includes a plurality of conductive layers. For example, the interconnect structure 210 includes a plurality of metal layers labeled as M1 through M4 and a plurality of conductors labeled as V1 through V3. Further, the metal layers M1 through M4 and the conductors V1 through V4 are disposed in a plurality of inter-metal dielectric layers labeled as IMD1 through IMD4. The inter-metal dielectric layers IMD1 through IMD4 may provide electrical insulating as well as structural support for the various features during many fabrication operations. In some embodiments, the inter-metal dielectric layer IMD1 through IMD4 may be formed of low-k dielectric material, for example, with k value lower than about 3.0, and even lower than about 2.5, but the disclosures is not limited to this. In some embodiments, a memory device can be integrated in the interconnect structure 210. For example, the memory device can be integrated over the metal layer M4 and the inter-metal dielectric layer IMD4, but the disclosure is not limited to this. In other words, the memory device can be integrated over any of the metal layers Mn and the inter-metal dielectric layer IMDn, and n is a positive integer. In some embodiments, the formation operations of the metal layers Mn and the conductors Vn can include forming openings in the inter-metal dielectric layer IMDn, filling the openings and performing a planarization such as chemical mechanical polish (CMP). In some embodiments, the metal layers M1 through M4 and the conductor V1 through V4 can include W, Al, Cu, AlCu, and the like. Additionally, a barrier layer (not shown) can be disposed between at least the metal layers M1 through M4 and the inter-metal layers IMD1 through IMD4.

Figure 2B:
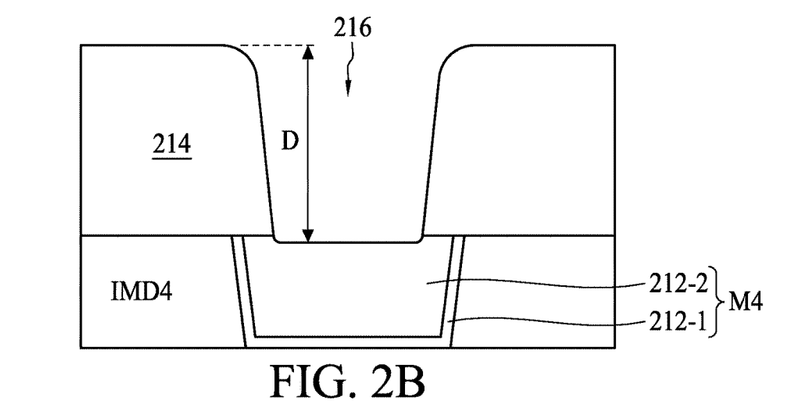

Please refer to FIG. 2B, in some embodiments, a conductive layer 212 such as the metal layer M4 is provided according to operation 100. However in some embodiments, the conductive layer 212 can be any of the metal layers Mn, and n is a positive integer, as mentioned above. In some embodiments, a trench may be formed in the inter-metal dielectric layer (IMD), a barrier layer 212-1 may formed to line a bottom and sidewalls of the trench, and a conductor layer 212-2 may be formed to fill the trench. In some embodiments, a planarization may be performed to remove superfluous conductor layer 212-2 and/or barrier layer 212-1. It should be understood that to mitigate metal diffusion, which may adversely affect electrical isolation of the surrounding IMD layers, the barrier layer 212-1 may be required. Therefore, the conductor layer 212-2 may be enclosed or encapsulated by the barrier layer 212-1. Next, a first dielectric layer 214, such as an inter-metal dielectric layer IMD5, is formed over the conductive layer 212. At least one trench 216 is formed in the first dielectric layer 214, and the conductive layer 212 is exposed from the trench 216, as shown in FIG. 2B. In some embodiments, a depth D of the trench 216 can be between approximately 250 angstroms (Å) and approximately 500 Å, but the disclosure is not limited to this.

Figure 2C:
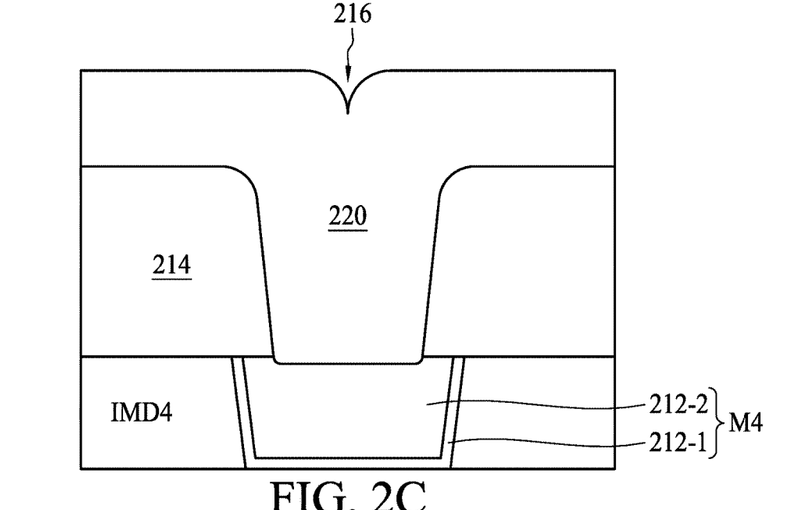

A second conductive layer 220 is formed in the trench 216 according to operation 104. In some embodiments, the formation of the second conductive layer 220 in the trench 216 further includes forming the conductive layer 220 over the first dielectric layer 214 to fill the trench 216 as shown in FIG. 2C. In some embodiments, the conductive layer 212 includes Cu, and the conductive layer 220 can include conductive materials that are able to be a Cu diffusion barrier. For example but not limited to, the conductive layer 220 can include tantalum nitride (TaN), tantalum (Ta), titanium nitride (TiN), tungsten nitride (WN), W, palladium (Pd), nickel (Ni), nickel chromium (NiCr), zirconium (Zr), and niobium (Nb).

Figure 2D:
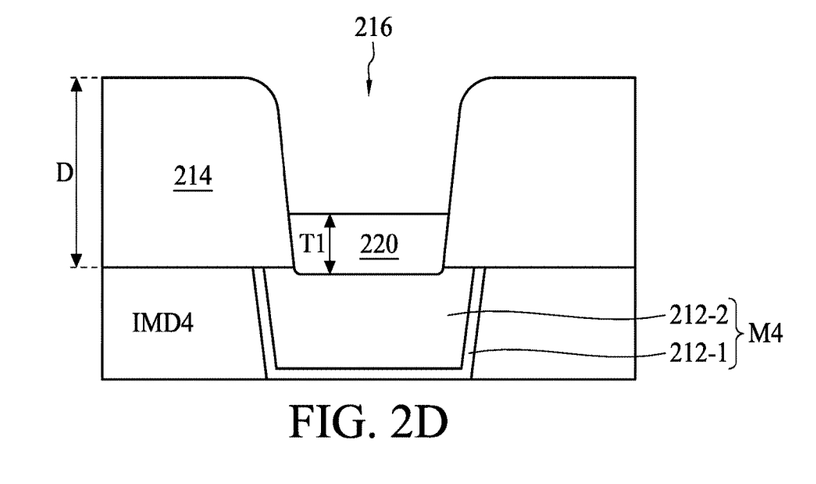

Referring to FIG. 2D, the conductive layer 220 is then etched back by any suitable etchant. Accordingly, a top surface of the conductive layer 220 is lower than an opening of the trench 216. In some embodiments, a thickness T1 of the conductive layer 220 in the trench 216 can be equal to or greater than 50 Å, but the disclosure is not limited to this. However, the thickness T1 of the conductive layer 220 can be limited by, for example but not limited to, an aspect ratio of the trench 216, as long as the thickness T1 is less than the depth D of the trench 216.

Figure 2E:
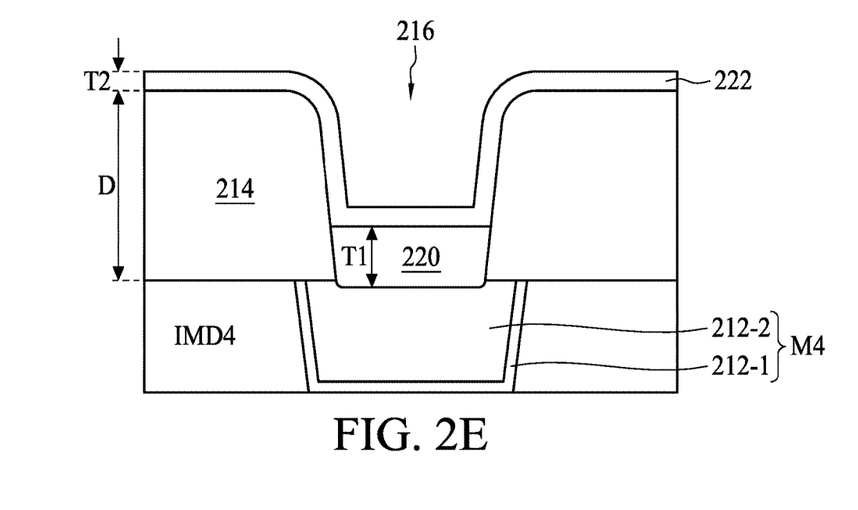

Referring to FIG. 2E, a conductive layer 222 is formed in the trench 216 according to operation 106. The conductive layer 222 is conformally formed in the trench 216, and thus the conductive layer 222 is in contact with a top surface of the conductive layer 220 and a portion of sidewalls of the trench 216, as shown in FIG. 2E. Accordingly, the conductive layer 222 is spaced apart from the conductive layer 212 by the conductive layer 220. More importantly, a resistivity of the conductive layer 222 is greater than a resistivity of the conductive layer 220. Further, a thermal conductivity of the conductive layer 222 is less than a thermal conductivity of the conductive layer 220. In some embodiments, a thickness T2 of the conductive layer 222 can be equal to or greater than 30 Å, but the disclosure is not limited to this. In some embodiments, the thickness T2 of the conductive layer 222 can be between about 30 Å and about 200 Å, but the disclosure is not limited to this. However, it should be easily realized that the thickness T2 of the conductive layer 222 can be limited by, for example but not limited to, an aspect ratio of the trench 216. In some embodiments, the conductive layer 222 includes TiN, but other suitable conductive material such as TaN or TaAlN may be used. Further, the conductive layer 222 can be formed by atomic layer deposition (ALD), but the disclosure is not limited to this. In some embodiments, the conductive layer 220 and the conductive layer 222 can include the same material. In other embodiments, the conductive layer 220 and the conductive layer 222 can include different materials.

Figure 2F:
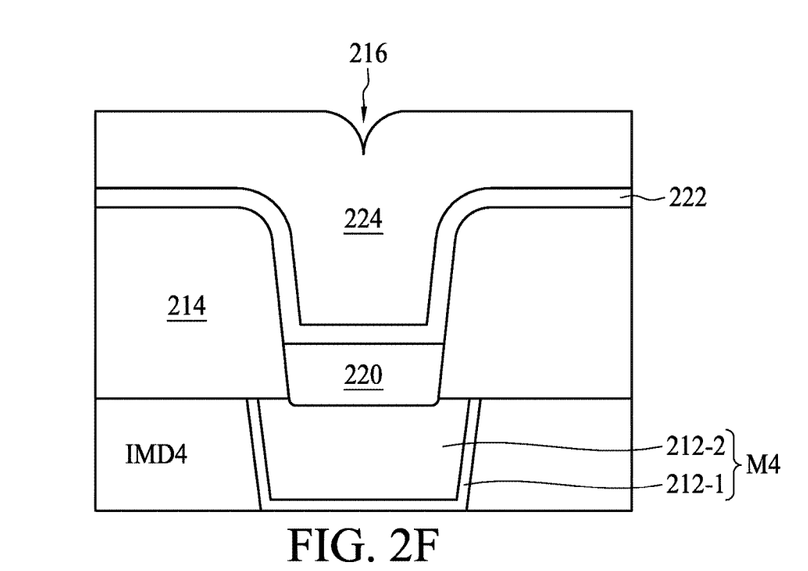
Figure 2G:
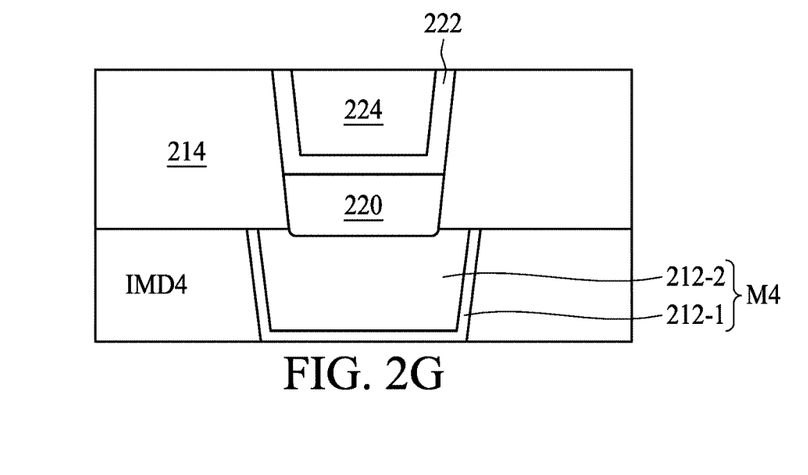

Referring to FIG. 2F, a second dielectric layer 224 is formed over the conductive layer 222 according to operation 108. The second dielectric layer 224 can include silicon oxide (SiO), silicon nitride (SiN), or silicon oxynitride (SiON), but the disclosure is not limited to this. In some embodiments, the second dielectric layer 224 and the first dielectric layer 214 can include the same material, but the disclosure is not limited to this. Further, the second dielectric layer 224 is formed to fill the trench 216, as shown in FIG. 2F. Subsequently, a planarization such as CMP operation is performed to remove a portion of the second dielectric layer 224 and a portion of the conductive layer 222, such that the first dielectric layer 214, the second dielectric layer 224 and the conductive layer 222 are all exposed as shown in FIG. 2G.

Figure 2H:
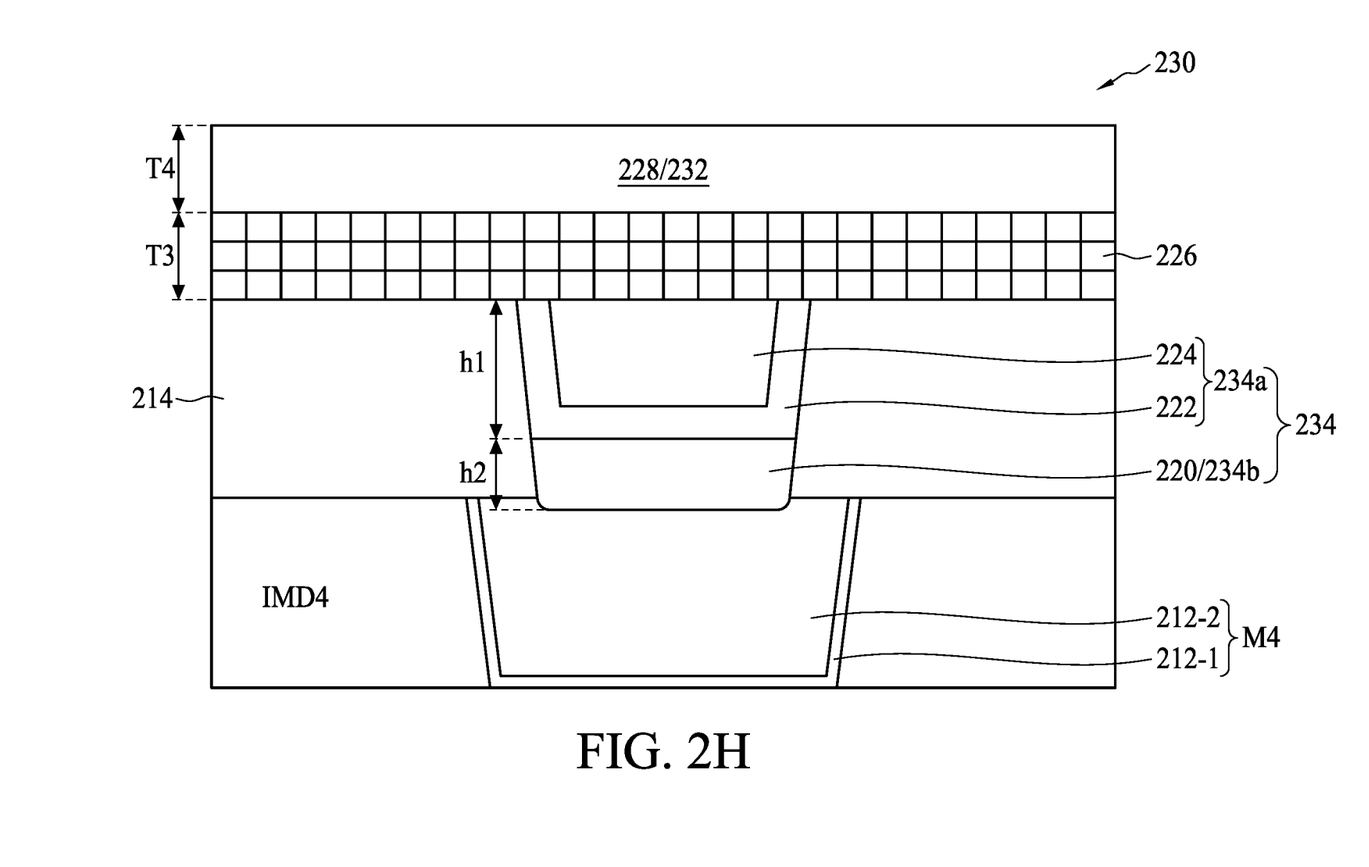

Referring to FIG. 2H, a phase change material 226 is then formed over the first dielectric layer 214, the second dielectric layer 224 and the conductive layer 222 according to operation 110. In some embodiments, a thickness T3 of the phase change material 226 can be between about 300 Å and about 400 Å, but the disclosure is not limited to this. In some embodiments, the phase change material 226 can include chalcogenide materials including one or more of germanium (Ge), tellurium (Te) and antimony (Sb) or stoichiometric materials. In some embodiments, the phase change material 226 can include a Ge)Sb—Te (GST) compound such as $Ge_2Sb_2Te_5$ (also referred to as GST225), but the disclosure is not limited to this. In some embodiments, the phase change material 226 can include Si—Sb—Te compounds, Ga—Sb—Te compounds, As—Sb—Te compounds, Ag—In—Sb—Te compounds, Ge—In—Sb—Te compounds, Ge—Sb compounds, Sb—Te compounds, Si—Sb compounds, and combinations thereof. The phase change material 226 is chosen to be a material that will undergo a phase change such as from amorphous to crystalline or vice-versa when heated by the conductive layer 222.

Still referring to FIG. 2H, subsequently a conductive layer 228 is formed over the phase change material 226, and thus a memory device 230 is obtained. In some embodiments, a thickness T4 of the conductive layer 228 is about 400 Å, but the disclosure is not limited to this. In the memory device 230, the conductive layer 228 serves as a top electrode 232 while the conductive layer 220, the conductive layer 222 and the second dielectric layer 224 serve as a bottom electrode 234. Accordingly, the memory device 230 includes the top electrode 232, the bottom electrode 234 adjacent to the conductive layer 212, and the phase change material 226 between the top electrode 232 and the bottom electrode 234. Further, the bottom electrode 234 includes a first portion 234a and a second portion 234b between the first portion 234a and the conductive layer 212. The first portion 234a and the second portion 234b can include different materials. As shown in FIG. 2H, the conductive layer 222 and the second dielectric layer 224 form the first portion 234a, and the conductive layer 220 forms the second portion 234b. Since the resistivity of the conductive layer 222 is greater than the resistivity of the conductive layer 220, more heat will be generated by the conductive layer 222. Accordingly, the conductive layer 222 serves as a heat-spreading layer while the conductive layer 220 serves as a heat-buffering layer. In some embodiments, the thickness T1 of the heat-buffering layer 220 is greater than the thickness T2 of the heat-spreading layer 222, as shown in FIG. 2E. However, a height h1 of the first portion 234a (including the conductive layer 222 and the second dielectric layer 224) and a height h2 of the second portion 234b (including the conductive layer 220) include a ratio, and the ratio is between about 4 and about 9, but the disclosure is not limited to this. More importantly, the heat-buffering layer 220 is disposed between the heat-spreading layer 222 and the conductive layer 212. Further, the heat-spreading layer 222 is in a ring shape from a top plan view, and the bottom and the sidewall of the second dielectric layer 224 are in contact with the heat-spreading layer 222. And the heat-buffering layer 220 is in contact with an entire bottom surface of the heat-spreading layer 222. Further, an outer surface of the ring-shaped heat-spreading layer 222 is aligned with and coupled to a sidewall surface of the heat-buffer layering 220.

Figure 2I:
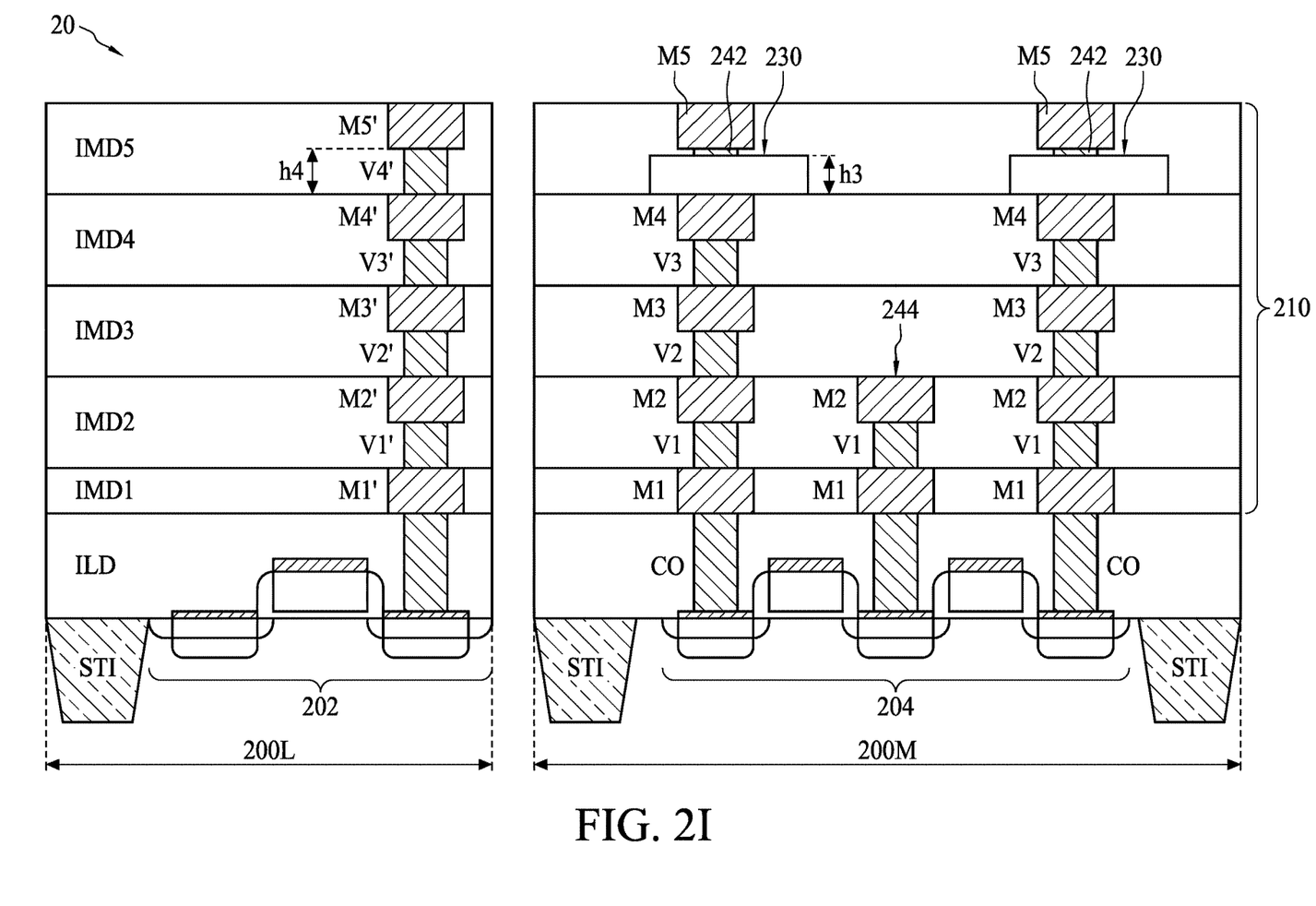

Referring to FIG. 2I, in some embodiments, another conductive layer 240 can be formed over the memory device 230, and a top conductor 242 can be disposed between the conductive layer 240 and the memory device 230 for providing electrical connection. The top conductor 242 is disposed between the top electrode 232 of the memory device 230 and the conductive layer 240. As mentioned above, the memory device 230 can be integrated in the interconnect structure 210, therefore in some embodiments, the first dielectric layer 214 can be formed simultaneously with an inter-metal dielectric layer IMD5. Similarly, the top conductor 242 can be formed simultaneously with the conductor V5, and the conductive layer 240 can be formed simultaneously with other conductive layer in the inter-metal layer IMD5, such as the metal layer M5, as shown in FIG. 2I.

Accordingly, a semiconductor structure 20 is therefore obtained. The semiconductor structure 20 can include the conductive layer 212 (or the metal layer M4), the conductive layer 240 (or the metal layer M5), and the memory device 230 disposed between the conductive layer 212 and the conductive layer 240. As mentioned above, the memory device 230 includes the top electrode 232, the bottom electrode 234 adjacent to the conductive layer 212, and the phase change material 226 between the top electrode 232 and the bottom electrode 234. In some embodiments, the semiconductor structure 20 includes the inter-metal dielectric layer IMD4, and the conductive layer 212 and other conductive layer such as the metal layer M4 are disposed in inter-metal dielectric layer IMD4. As shown in FIGS. 2H and 2I, the semiconductor structure 20 includes the dielectric layer 214 serving as a portion of the inter-metal dielectric layer IMD5, and the conductive layer 240 and other conductive layer such as the metal layer M5 are disposed in the inter-metal dielectric layer IMD5. Further, the semiconductor structure 20 further includes the conductors V5 disposed in the inter-metal dielectric layer IMD5 to electrically connect the metal layer M5 in the inter-metal dielectric layer IMD5 and the metal layer M4 in the inter-metal dielectric layer IMD4. In some embodiments, a height h3 of the memory cell 230 is less than a height h4 of the conductors V5. In some embodiments, a sum of the height h3 and a height of the top conductor 242 is substantially equal to the height h4 of the conductors V5, but the disclosure is not limited to this.

Referring to FIGS. 2H and 2I, the memory device 230 is electrically connected to the access transistor 204 through the interconnect structure 210 and the contact plug CO in the memory region 200M. Further, the memory device 230 is electrically connected to a word line or a source line 244 through the interconnect structure 210, the contact plug CO and the access transistor 204, as shown in FIG. 2I. Further, other operations such as providing other electrical connection between the memory device 230 and a bit line (not shown) through the conductive layer 240 (M5 of the interconnect structure 210) can be performed. Additionally, the transistor 202 in the logic region 200L can be electrically connected to other circuitry or element through the interconnect structure 210 located in the logic region 200L.

Figure 3:
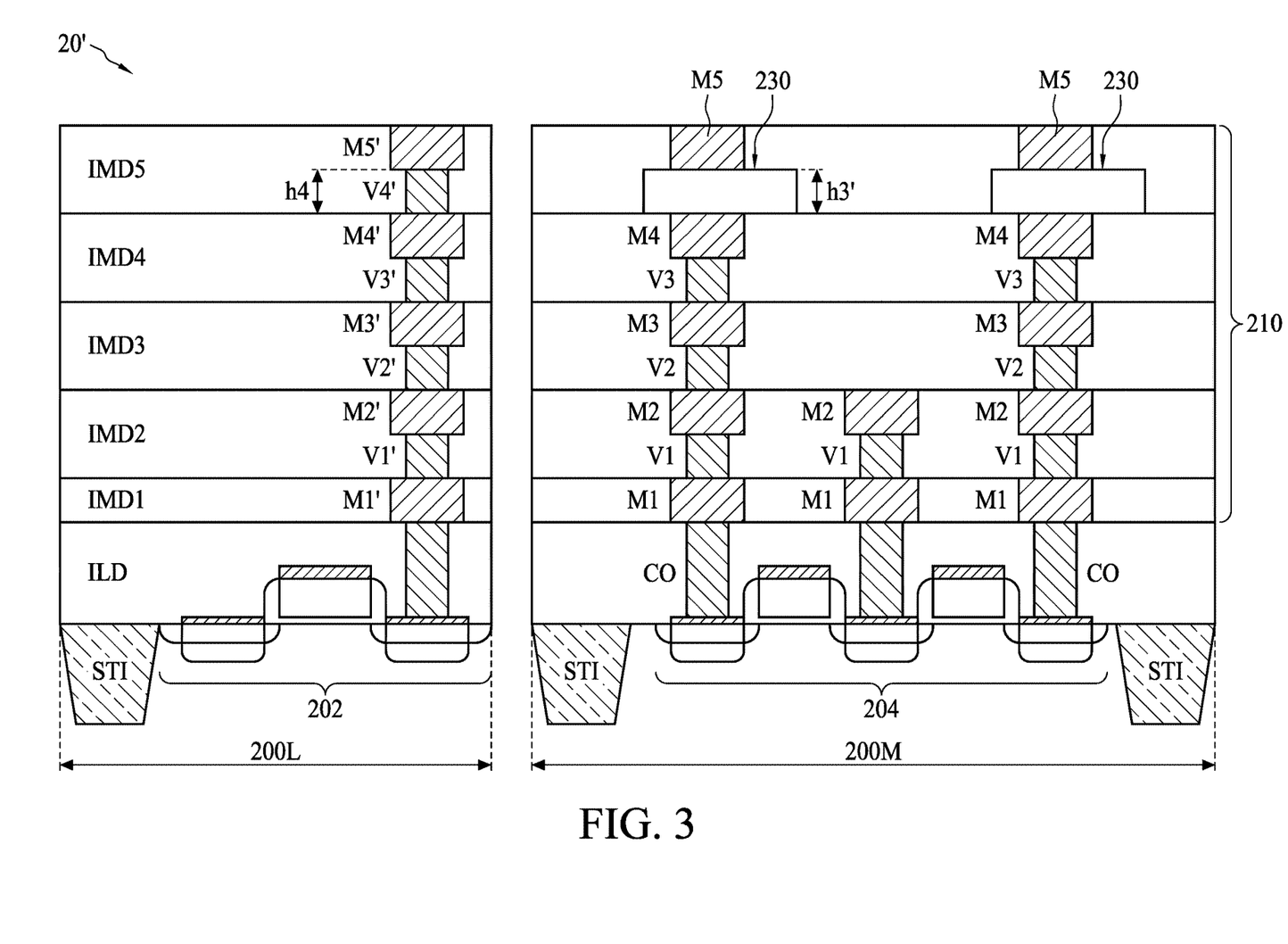
FIG. 3 is a schematic drawing illustrating a semiconductor memory structure according to aspects of the present disclosure in one or more embodiments.

Referring to FIG. 3, which is a schematic drawing illustrating a semiconductor memory structure 20' according to aspects of the present disclosure in one or more embodiments. It should be noted that elements same in FIGS. 2A-2I and FIG. 3 are designated by the same numerals. Further, those elements can include the same materials and be formed by the same operations, therefore those details are omitted in the interest of brevity and only differences are discussed. In some embodiments, the method for forming the semiconductor structure including the memory device 10 can be performed to form the semiconductor structure 20' and the memory device 230 is integrated in the interconnect structure 210. However, a height h3' of the memory cell 230 can be equal to the height h4 of the conductor V5. Accordingly, the top electrode 232 of the memory device 203 is in contact with the conductive layer 240, such as the metal layer M5 of the interconnect structure 210, as shown in FIG. 3.

Figure 4:
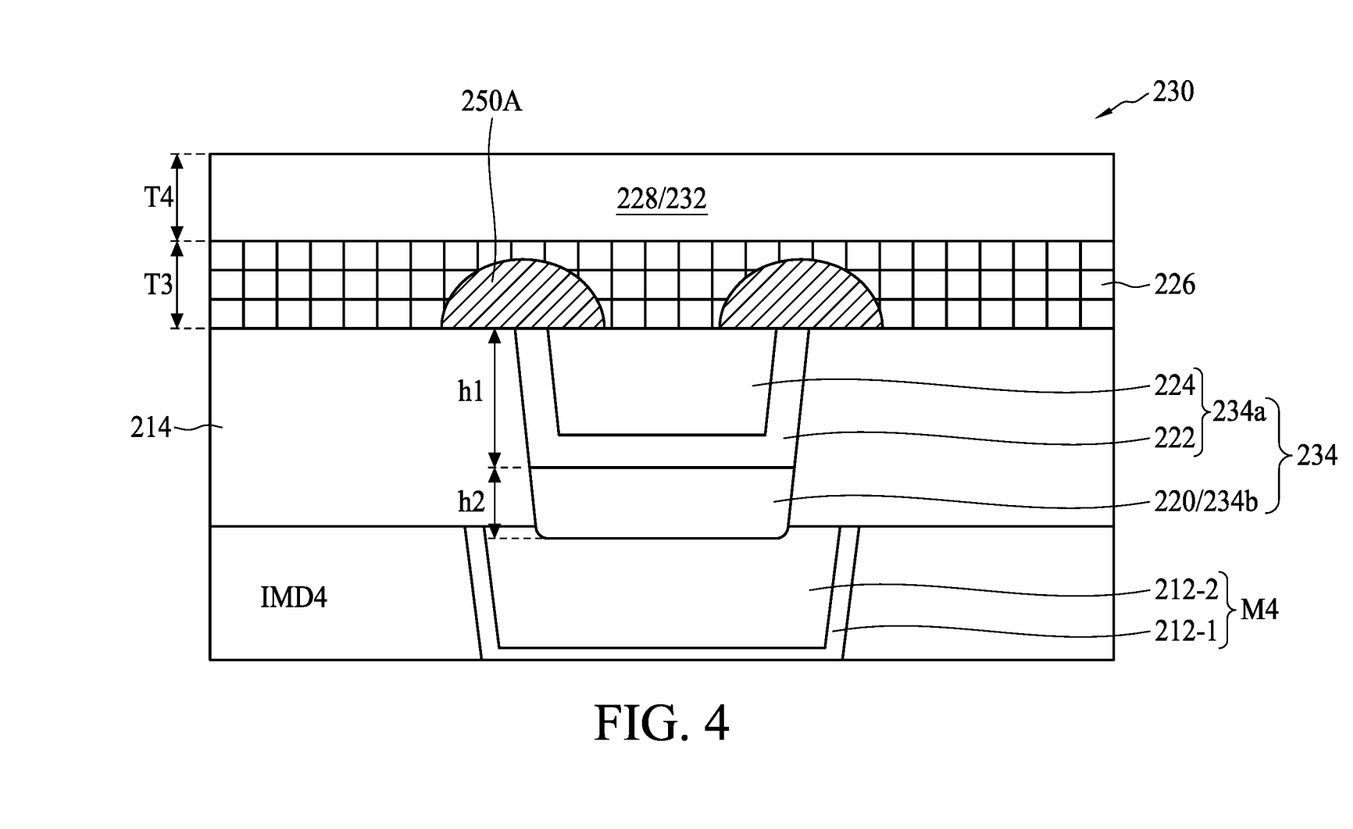
FIG. 4 is a schematic drawing illustrating the memory device in reset state according to aspects of the present disclosure in one or more embodiments.

Referring to FIG. 4, which is a schematic drawing illustrating the memory device in a reset state according to aspects of the present disclosure in one or more embodiments, since the resistivity of the conductive layer 222 is greater than the resistivity of the conductivity layer 220, heat is generated in and spread from the conductive layer 222 when sufficient currents is applied to the conductive layer 222. Accordingly, the conductive layer 222 serves as the heat-spreading layer of the bottom electrode 234, as mentioned above. The phase change material 226 is heated up to a temperature higher than a melting temperature by the heat-spreading layer 222. The temperature can be quickly dropped below the crystallization temperature, which is referred as "quench", and thus a portion of the phase change material 226 is changed to an amorphous state with a high resistivity as schematically shown in region 250A in FIG. 4. Accordingly, the memory device 230 is in a high-resistance state and stores a data value of "0" in a reset state. Additionally, since the thermal conductivity of the conductive layer 220 is greater than the thermal conductivity of the conductive layer 222, heat can be quenched faster due to the conductive layer 220. In other words, the quench operation is shortened. Additionally, it should be noted that the heat-spreading layer 222 is in a ring shape from a top plan view. Therefore, the region 250A is in a ring shape inherited from the heat-spreading layer 222.

Figure 5:
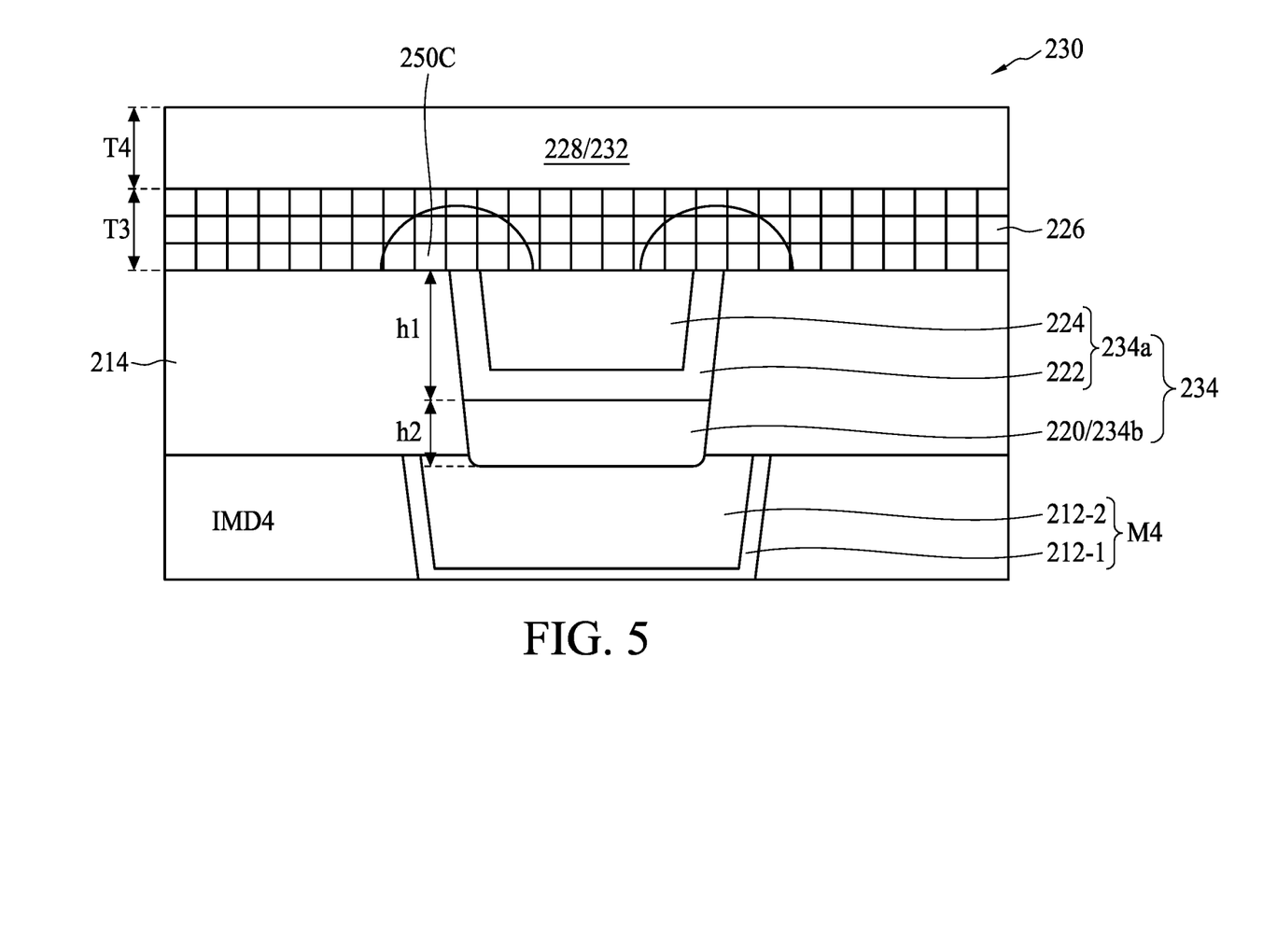
FIG. 5 is a schematic drawing illustrating the memory device in set state according to aspects of the present disclosure in one or more embodiments.

Referring to FIG. 5, which is a schematic drawing illustrating the memory device in a set state according to aspects of the present disclosure in one or more embodiments, the region 250A can be set back to the crystalline state by heating up the phase change material 226 to a temperature higher than the crystalline temperature but below the melting temperature by the heat-spreading layer 222, for a period time. Thus, the portion of the phase change material 226 is changed to a crystalline state with a low resistivity as schematically shown in region 250C in FIG. 5. Accordingly, the memory device 230 is in a low-resistance state and stores a data value of "1" in a set state. Additionally, it should be noted that the heat-spreading layer 222 is in a ring shape from a top plan view. Therefore, the region 250C is in a ring shape inherited from the heat-spreading layer 222.

Still referring to FIGS. 4 and 5, the conductive layer 220, which includes resistivity lower than the conductive layer 222, serves as the heat-buffering layer of the bottom electrode 234, as mentioned above. It should be noted that since the heat-spreading layer 222 is spaced apart from the conductive layer 212 by the heat-buffering layer 220, heats are buffered by the heat-buffering layer 220. In other words, the conductive layer 212 is in contact with the heat-buffering layer 220 which has the temperature lower than the heat-spreading layer 220, consequently the metal diffusion is reduced due to the lower temperature. Additionally, since the heat-buffering layer 220 includes the conductive material having diffusion barrier ability, the conductive layer 212 can be enclosed by the diffusion barrier layers (i.e. the barrier layer 212-1 and the heat-buffer layer 220) and thus the metal diffusion issue of the conductive layer 212 is further mitigated. Accordingly, not only the performance and reliability of the memory device 230 is improved, but also the reliability of the interconnect structure 210 is improved.

Accordingly, the present disclosure therefore provides a semiconductor structure including a memory device and a method for forming the same. In some embodiments, a heat-buffering layer is introduced between the heat-spreading layer and the conductive layer of the interconnect structure, and thus heat required to cause the state change for the phase change material is buffered from the conductive layer in the interconnect structure. Consequently, metal diffusion and metal loss issue are both mitigated by the heat-buffering layer, and thus reliability of the phase change memory device and interconnect structure are both improved.

In some embodiments, a method for forming a semiconductor structure is provided. The method includes following operations. A first conductive layer is formed. A first dielectric layer is formed over the first conductive layer, and the first dielectric layer includes at least one trench exposing the first conductive layer. A second conductive layer is formed in the trench. A third conductive layer is formed in the trench, and a resistivity of the third conductive layer is greater than a resistivity of the second conductive layer. A second dielectric layer is formed over the third conductive layer. A phase change material is formed over the first dielectric layer.

In some embodiments, a method for forming a semiconductor structure is provided. The method includes following operations. A first dielectric layer is formed over a first conductive layer. The first conductive layer is exposed through a bottom of a trench in the first dielectric layer. A second conductive layer is formed in the trench and covering a top surface of the first dielectric layer. A portion of the second conductive layer is removed such that a top surface of the second conductive layer is lower than the top surface of the first dielectric layer. A third conductive layer is formed in the trench and covering the first dielectric layer. A second dielectric layer is formed over the third conductive layer and the first dielectric layer. A portion of the third conductive layer and a portion of the second dielectric layer are removed to expose the top surface of the first dielectric layer.

In some embodiments, a method for forming a semiconductor structure is provided. The method includes following operations. A first dielectric layer is formed over a lower conductive layer. The first dielectric layer includes at least one trench exposing the first conductive layer. A heat-butting layer is formed in the trench. A heat-spreading layer is stacked over the heat-spreading layer in the trench. The trench is filled with a second dielectric layer. A phase change material is disposed over the first dielectric layer. A top electrode is formed over the phase change material. The second dielectric layer, the heat-spreading layer and the heat-buffering layer form a bottom electrode. A resistivity of the heat-buffering layer is less than a resistivity of the heat-spreading layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein.

What is claimed is:

1. A method for forming a semiconductor structure, comprising:
    forming a first metal layer, wherein a material of the first metal layer is selected from the group consisting of tungsten (W), aluminum (Al), and aluminum copper (AlCu);
    forming a first dielectric layer over the first metal layer, the first dielectric layer comprising at least one trench exposing the first metal layer, wherein a bottom surface of the first dielectric layer is aligned with a top surface of the first metal layer;
    forming a second metal layer in the trench, wherein a material of the second metal layer is selected from the group consisting of tantalum (Ta), titanium nitride (TiN), tungsten nitride (WN), tungsten (W), palladium (Pd), nickel chromium (NiCr), zirconium (Zr), and niobium (Nb);
    forming a third metal layer in the trench, wherein a resistivity of the third metal layer is greater than a resistivity of the second metal layer, and a material of the third metal layer is selected from the group consisting of titanium nitride (TiN), tantalum nitride (TaN), and tantalum aluminum nitride (TaAlN);
    forming a second dielectric layer over the third metal layer; and
    forming a phase change material over the first dielectric layer,
    wherein a top surface of the third metal layer is entirely in contact with the phase change material.

2. The method of claim 1, wherein the material of the first metal layer is different from the material of the second metal layer.

3. The method of claim 1, wherein the material of the second metal layer is different from the material of the third metal layer.

4. The method of claim 1, wherein the material of the second metal layer and the material of the third metal layer are the same.

5. The method of claim 1, further comprising forming a fourth metal layer over the phase change material.

6. A method for forming a semiconductor structure, comprising:
    forming a first dielectric layer over a first metal layer, wherein a material of the first conductive layer is selected from the group consisting of W, Al and AlCu;
    exposing the first metal layer through a bottom of a trench in the first dielectric layer;
    forming a second metal layer in the trench and covering a top surface of the first dielectric layer, wherein a material of the second metal layer is selected from the group consisting of Ta, TiN, WN, W, Pd, NiCr, Zr, and Nb;
    removing a portion of the second metal layer such that a top surface of the second metal layer is lower than the top surface of the first dielectric layer;
    forming a third metal layer in the trench and covering the first dielectric layer, wherein a material of the third conductive layer is selected from the group consisting of TiN, TaN, and TaAlN;
    forming a second dielectric layer over the third metal layer and the first dielectric layer;
    removing a portion of the third metal layer and a portion of the second dielectric layer to expose the top surface of the first dielectric layer; and
    forming a phase change material over the first dielectric layer, the second dielectric layer and the third metal layer,
wherein a top surface of the third metal layer is entirely in contact with the phase change material.

7. The method of claim 6, wherein the material of the first metal layer is different from the material of the second metal layer.

8. The method of claim 6, wherein a top surface of the second dielectric layer is in contact with the phase change material.

9. The method of claim 6, wherein a resistivity of the third metal layer is greater than a resistivity of the second metal layer.

10. The method of claim 6, wherein a thickness of the second metal layer is greater than a thickness of the third metal layer.

11. The method of claim 6, further comprising forming a fourth metal layer over the phase change material.

12. The method of claim 11, further comprising forming a fifth metal layer over the fourth metal layer, and the fifth metal layer is in contact with the fourth metal layer.

13. The method of claim 11, further comprising:
    forming a conductor over the fourth metal layer; and
    forming a fifth metal layer over the conductor,
wherein the fourth metal layer is electrically connected to the fifth metal layer by the conductor.

14. A method for forming a semiconductor structure, comprising:
    forming a first dielectric layer over a lower conductive layer, the first dielectric layer comprising at least one trench exposing the lower conductive layer, wherein a bottom surface of the first dielectric layer is aligned with a top surface of the lower conductive layer, wherein a material of the lower conductive layer is selected from the group consisting of tungsten (W), aluminum (Al), and aluminum copper (AlCu);
    forming a heat-buffering layer in the trench, wherein a material of the heat-buffering layer is selected from the group consisting of tantalum (Ta), titanium nitride (TiN), tungsten nitride (WN), tungsten (W), palladium (Pd), nickel chromium (NiCr), zirconium (Zr), and niobium (Nb);
    stacking a heat-spreading layer over the heat-buffering layer in the trench;
    filling the trench with a second dielectric layer;
    disposing a phase change material over the first dielectric layer; and
    forming a top electrode over the phase change material,
wherein the second dielectric layer, the heat-spreading layer, and the heat-buffering layer form a bottom electrode, and a resistivity of the heat-buffering layer is less than a resistivity of the heat-spreading layer.

15. The method of claim 14, wherein a thickness of the heat-buffering layer is greater than a thickness of the heat-spreading layer.

16. The method of claim 14, wherein a top surface of the second dielectric layer is entirely in contact with the phase change material.

17. The method of claim 14, further comprising forming an upper conductive layer over the top electrode.

18. The method of claim 17, wherein the top electrode is in contact with the upper conductive layer.

19. The method of claim 17, further comprising a conductor electrically connecting the top electrode and the upper conductive layer.

20. The method of claim 14, wherein a sidewall of the heat-spreading layer is aligned with a sidewall of the heat-buffering layer.

* * * * *